United States Patent [19]

Kaneko et al.

[11] 4,051,389

[45] Sept. 27, 1977

[54] FLIP-FLOP CIRCUIT

[75] Inventors: Kenji Kaneko, Kokubunji; Takahiro Okabe, Tokyo, both of Japan

[73] Assignee: Hitachi, Ltd., Japan

[21] Appl. No.: 666,418

[22] Filed: Mar. 12, 1976

[30] Foreign Application Priority Data

Mar. 12, 1975 Japan .............................. 50-29020
July 23, 1975 Japan .............................. 50-89254

[51] Int. Cl.$^2$ .............................................. H03K 3/29
[52] U.S. Cl. .............................. 307/291; 307/247 R; 307/279; 307/299 B; 307/303; 357/35; 357/44; 357/46
[58] Field of Search ............... 307/291, 292, 303, 213, 307/220, 225 R, 288, 299 B, 247, 279, 35; 357/44, 46; 340/173 FF

[56] References Cited

U.S. PATENT DOCUMENTS

| 3,309,534 | 3/1967 | Yu et al. | 307/292 |
| 3,459,974 | 8/1969 | May | 307/247 R |
| 3,474,261 | 10/1969 | Ryerson et al. | 307/291 |
| 3,617,778 | 11/1971 | Korom | 307/303 |
| 3,783,400 | 1/1974 | Gay | 307/299 B |

OTHER PUBLICATIONS

1973 *IEEE Intercon Technical Papers*, vol. 6, *Solid State*, IEEE Convention Mar. 26-30, 1973, p. 30 4:1,2, "High Density Bipolar Memories and Logic," Wiedmann, S. K.

*Primary Examiner*—John Zazworsky
*Assistant Examiner*—Marcus S. Rasco
*Attorney, Agent, or Firm*—Craig & Antonelli

[57] ABSTRACT

A flip-flop circuit comprises a pair of inversely operated first and second npn vertical transistors. The first npn transistor has dual collectors. Also provided are a pair of first and second pnp lateral transistors operated as loads and a pair of third and fourth pnp lateral transistors for triggering, each base of the first and second npn vertical transistors being connected to a collector of the second npn transistor and to one of the dual collectors of the first npn transistor, respectively. Each collector of the first and second pnp transistors is connected to said one of the dual collectors of the first npn transistor and to the collector of the second npn transistor, respectively. Each emitter of the first and second pnp transistors is connected to an electric source, each base of the first and second npn transistors is connected to each emitter of the third and fourth pnp transistors, respectively, and each base of the third and fourth pnp transistors is connected to said one of the dual collectors of the first npn transistor through a first resistor and to the collector of the second npn transistor through a second resistor. Each collector of the third and fourth pnp transistors is connected to an input terminal for trigger signals, an output terminal is connected to the other collector of the dual collectors of the first npn transistor, and each emitter of the first and second npn transistors and each base of said first and second pnp transistors is grounded.

7 Claims, 8 Drawing Figures

FLIP-FLOP CIRCUIT

FIELD OF THE INVENTION

The present invention relates to a flip-flop circuit, and more particularly to a trigger-type flip-flop circuit (hereinafter, it is referred as a T-FF circuit).

DESCRIPTION OF THE PRIOR ART

In conventional semiconductor integrated circuits, there have been utilized transistors, each of which has such structure that a base region is disposed in a semiconductor body being operated as a collector and an emitter region is disposed in the base region, that is, a forwardly operated transistor. This type of conventional semiconductor integrated circuit, however, has such drawbacks that the operating voltage is high, and hence the power consumption thereof becomes large, and the integration density does not become so high.

For eliminating these disadvantages, there has been proposed a circuit wherein a transistor is operated inversely, i.e. the emitter and the collector in the conventional transistor are operated as the collector and the emitter, respectively. This circuit is an inverter circuit and comprises a combination of the inversely operated vertical transistor and a lateral transistor which is operated as a load and whose polarity relation is opposite to the inversely operated vertical transistor, and is called an Integrated Injection Logic circuit (hereinafter, referred as IIL circuit).

This IIL circuit has many advantages, when compared with the circuit wherein the forwardly operated transistors are utilized. That is, it is operated by a supply voltage of about 0.7 V, and hence the power consumption becomes very low; since, in the integrated circuit, the emitters of the inversely operated transistors are connected in common, there is no necessity to dispose a wiring for ground, and hence patterns for the integrated circuit become simple and the integration density becomes high; since the base and the emitter of the lateral transistor operated as the load are in connected common with the emitter and the base of the inversely operated transistor, respectively, the occupying area of the load becomes very small when compared with that of the load resistor utilized in the conventional integrated circuit; and since the emitters of the inversely operated transistors are connected in common, there is no necessity to dispose diffused regions for isolating the circuit elements, the hence an occupying area of this circuit on a chip becomes very small in cooperation with said occupying area of the load.

The fundamental structures and operations of the IIL circuit are disclosed in detail in, for example, U.S. Pat. No. 3,736,477, in the article of "I²L takes bipolar integration, a significant step forward" in Electronics, Feb. 6, 1975, pp. 83 – 90, and in the article of "Integrated Injection Logic (I²L)" in Philips Technical Review, Vol. 33, No. 3, pp. 76 – 85.

T-FF circuits are frequently utilized for constructing a counter circuit, and it has been proposed to utilize an IIL circuit in said T-FF circuit, such as a master-slave-type T-FF circuit and a delay-type T-FF circuit which is shown in FIG. 14 on Page 83 in the article of Philips Technical Review, and in FIG. 8 on Page 87 in the article of Electronics.

This T-FF circuit utilizing an IIL circuit therein, however, has such drawbacks that the occupying area thereof on the chip does not become so small and the power consumption becomes rather large, though the logical design thereof becomes easy.

SUMMARY OF THE INVENTION

It is therefore an object of the present invention to provide T-FF circuit utilizing IIL circuit therein wherein the drawbacks in the conventional T-FF circuit disclosed above are reduced.

It is another object of the present invention to provide T-FF circuit utilizing IIL circuit therein whose occupying area on the chip is small.

It is still another of the present invention to provide T-FF circuit utilizing IIL circuit therein whose power consumption is reduced to about $\frac{1}{3}$ of that of the above-described conventional T-FF circuit utilizing IIL circuit therein.

These objects are attained by a flip-flop circuit comprising a pair of inversely operated first and second transistors, the first transistor having dual collectors, a pair of third and fourth transistors whose polarity relations are opposite to those of the first and second transistors and which are operated as loads, a pair of fifth and sixth transistors for triggering whose polarity relations are opposite to those of the first and second transistors, each base of the first and second transistors being connected to a collector of the second transistor and to one of the dual collectors of the first transistor, respectively, each collector of the third and fourth transistors being connected to the one of the dual collectors of the first transistor and to the collector of the second transistor, respectively, each emitter of the third and fourth transistors being connected to a first power supply means, each base of the first and second transistors being connected to each emitter of the fifth and sixth transistors, respectively, each base of the fifth and sixth transistors being connected to the one of the dual collectors of the first transistor through first delay means and to the collector of the second transistor through second delay means, respectively, each collector of the fifth and sixth transistors being connected to an input terminal for trigger signals, an output terminal being connected to the other collector of the dual collectors of the first transistor, and each emitter of the first and second transistors and each base of the third and fourth transistors being connected to a second power supply means.

In the present invention, it is preferrable that the first and second transistors are vertical type and the third and fourth transistors are of lateral type. It is further preferable that the fifth and sixth transistors are lateral type.

Other objects, features and advantages of the present invention will become more apparent from the following detailed description beginning with a brief explanation of a conventional T-FF circuit utilizing therein IIL circuits in conjunction with the accompanying drawing wherein like reference numerals are used to denote like parts. It should be noted that these embodiments are mere examples and the various changes and modifications can be made without departing from the spirit of the present invention.

DETAILED DESCRIPTION OF THE PRIOR ART

Figure 1:
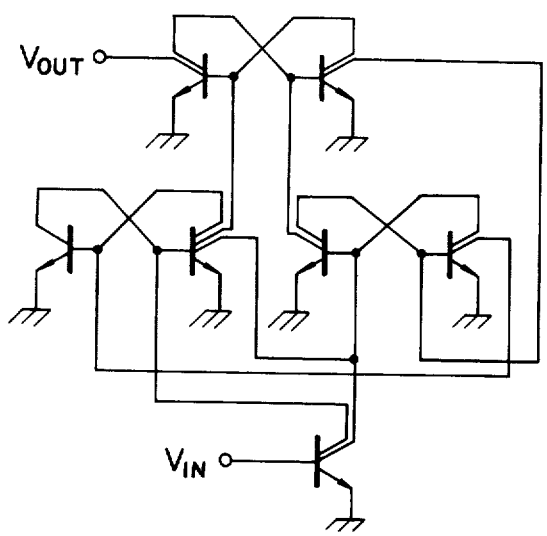
FIG. 1 shows a circuit diagram of the conventional T-FF circuit utilizing therein IIL circuits.

Referring now to FIG. 1, there is shown a concrete circuit diagram of the delay-type T-FF circuit proposed in FIG. 14 on Page 83 in the article of Philips Technical Review disclosed above. In the figure, transistors being operated as loads are omitted.

As is apparent from FIG. 1, seven base regions and fourteen collector regions in the inversely operated transistors are required for this delay-type T-FF circuit. Since the occupying area on the chip of this circuit is determined by the numbers of these base and collector regions, it does not become small and is almost 250 μm × 200 μm in case that wirings 15 μm in width and the distance between adjacent wirings being 5 μm are utilized and the collector size of the inversely operated transistor is 20 μm × 20 μm.

Further, since this delay-type T-FF circuit requires three flip-flop stages and one inverter stage, there is such a disadvantage that the power consumption becomes rather large.

According to the present invention, the above-mentioned disadvantages in the conventional T-FF circuit are reduced. Especially, the consumption power is reduced to ⅓ of that of the conventional T-FF circuit.

DETAILED DESCRIPTION OF THE INVENTION

Figure 2:
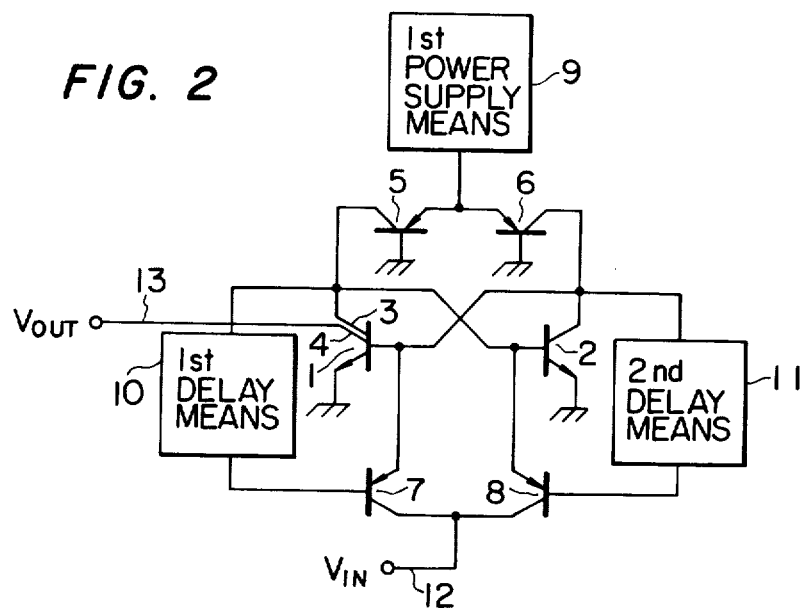
FIG. 2 shows a fundamental circuit diagram of the present invention.

FIG. 2 is a fundamental circuit diagram of the present invention, and which comprises a pair of inversely operated first and second transistors 1 and 2, the first transistor 1 having dual collectors 3 and 4, a pair of third and fourth transistors 5 and 6 whose polarity relations are opposite to those of the first and second transistors 1 and 2 and which are operated as loads, a pair of fifth and sixth transistors 7 and 8 for triggering whose polarity relations are opposite to those of the first and second transistors 1 and 2, each base of the first and second transistors 1 and 2 being connected to the collector of the second transistor 2 and to the collector 3 of the first transistor 1, respectively, each collector of the third and fourth transistors 5 and 6 being connected to the collector 3 of the first transistor 1 and to the collector of the second transistor 2, respectively, each emitter of the third and fourth transistors 5 and 6 being connected to a first power supply means 9, each base of the first and second transistors 1 and 2 being connected to each emitter of the fifth and sixth transistors 7 and 8, respectively, each base of the fifth and sixth transistors 7 and 8 being connected to the collector 3 of the first transistor 1 through first delay means 10 and to the collector of the second transistor 2 through second delay means 11, respectively, each collector of the fifth and sixth transistors 7 and 8 being connected to an input terminal 12 for trigger signals, an output terminal 13 being connected to the other collector 4 of the first transistor 1, and each emitter of the first and second transistors 1 and 2 and each base of the third and fourth transistors 5 and 6 being connected to a second power supply means.

In FIG. 2, a pair of inversely operated npn vertical transistors are utilized for the first and second transistors 1 and 2, and pnp lateral transistors are utilized for the third, fourth, fifth and sixth transistors.

The pair of inversely operated npn vertical transistors 1 and 2 and the pair of pnp lateral transistors 5 and 6 operated as loads constitute a flip-flop circuit. The lateral pnp transistors 7 and 8 are for triggering and serve as condenser couplings. The delay means 10 and 11 are for obstructing errors in operation at the triggering and for supplying memory information to the pnp lateral transistors 7 and 8 informations of memories in said flip-flop.

Figure 3:
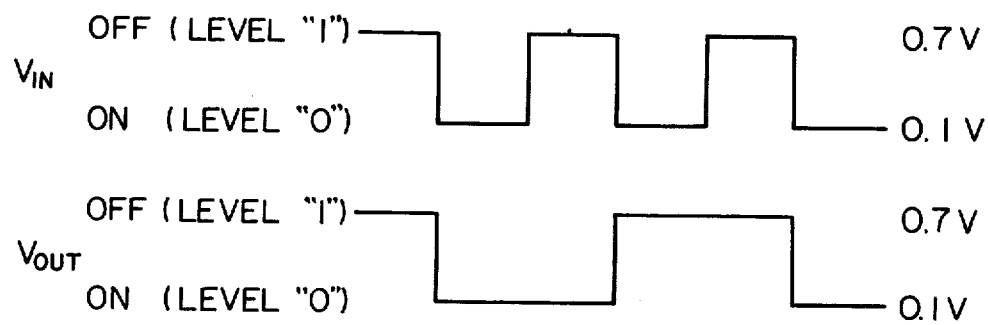
FIG. 3 shows wave forms for explaining the operation of the present invention.

The operation of this T-FF circuit shown in FIG. 2 will be explained hereinbelow referring to FIG. 3.

Assuming that the inversely operated first transistor 1 is OFF and the inversely operated second transistor 2 is when an inversely operated transistor (not shown) in the preceding stage which drives input voltages $V_{IN}$ is OFF, i.e. the input voltage $V_{IN}$ is at the level of "1", and hence that a collector potential of the inversely operated first transistor 1 is about 0.7 V and that of the inversely operated second transistor 2 is about 0.1 V, the base potential of the sixth transistor 8 has a value almost the same as that of the collector potential of the inversely operated second transistor 2, i.e. about 0.1 V, since the base of the sixth transistor 8 is connected to the collector of the inversely operated second transistor 2 through the second delay means 11. The collector potential of the sixth transistor 8 becomes same as that of inversely operated first transistor, 1, i.e. about 0.7 V, since the collector of the sixth transistor 8 is in the floating state and is connected to the collector of the inversely operated first transistor 1 through the emitter of the sixth transistor 8. Therefore, the emitter-base junction and the collector-base junction of the sixth transistor 8 are in the forwardly biased states, and sufficiently excess minority carriers are accumulated thereat.

While the base potential of the fifth transistor 7 is about 0.7 V since the base of the fifth transistor 7 is connected to the collector of the inversely operated first transistor 1 through the first delay means 10, the emitter potential of the fifth transistor 7 is about 0.1 V, and the collector potential of the fifth transistor 7 is about 0.7 V since the collector of the fifth transistor 7 is connected to the collector of the sixth transistor 8. Therefore, the emitter-base junction and the collector-base junction of the fifth transistor 7 are reversely biased, and no charge carriers are accumulated thereat.

As is apparent from the above descriptions, charge carriers corresponding to memory states of the flip-flop are accumulated at the collector-base junction of the fifth and sixth transistors 7 and 8.

When the transistor in the preceding stage which drives the input voltage $V_{IN}$ is turned ON, although the fifth transistor 7 does not change its state since it is cut-off, the sixth transistor 8 is turned ON, since the sixth transistor 8 is storing charge carriers, and hence the base potential thereof is lowered. For this reason, an amount of charge carriers equal to the amplification factor times as much as stored charges begin to flow from the emitter of the sixth transistor 8 to the collector thereof. Therefore, the inversely operated second transistor 2 is turned OFF, and the inversely operated first transistor 1 is turned ON, that is the state of the flip-flop is inverted or reversed. In this inverted state, the fifth and sixth transistors 7 and 8 are OFF. When the input voltage $V_{IN}$ is changed to the level "1", the inversion of flip-flop is not caused, but the collector-base junction of the fifth transistor 7 is forwardly biased through the first delay means 10 and hence informations for triggering is stored, since the inversely operated second transistor 2 is OFF.

As described above, the state of the flip-flop is inverted only when the input voltage $V_{IN}$ is changed to the level "0" from the level "1"; and it is not inverted, but rather information for triggering is stored, when the input voltage $V_{IN}$ is changed to the level "1" from the level "0". In other words, the relation between the input voltage $V_{IN}$ and the output voltage $V_{OUT}$ shown in FIG. 3 is obtained by the present invention. From this relation, it will be easily understood that the operation of T-FF circuit is attained by the present invention.

Figure 4:
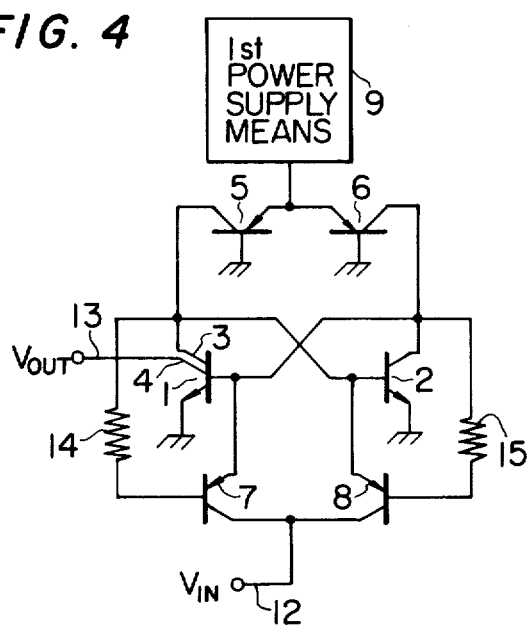
FIG. 4 shows a circuit diagram of one embodiment of the present invention.

FIG. 4 shows a circuit diagram of one embodiment of the present invention.

In this circuit, a first resistor 14 and a second resistor 15 are connected between the collector 3 of the first inversely operated transistor 1 and the base of the fifth transistor 7 and between the collector of the second inversely operated transistor 2 and the base of the sixth transistor 8, respectively. The resistors 14 and 15 function with the junction capacitances in the fifth and sixth transistors 7 and 8 as the first and second delay means 10 and 11 in the circuit shown in FIG. 2, respectively.

The operation of this circuit shown in FIG. 4 is the same as that of the circuit shown in FIG. 2.

Figure 5:
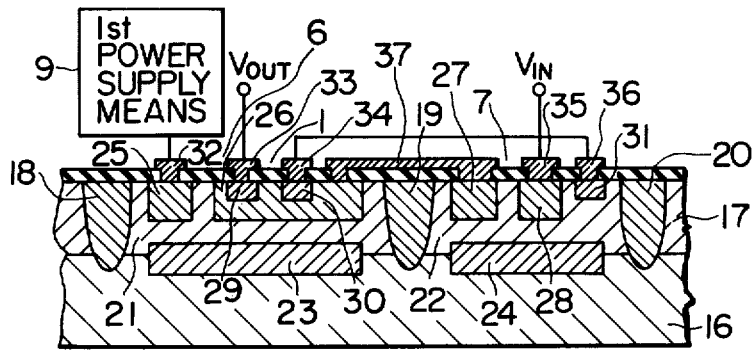
FIG. 5 is a sectional view of a semiconductor device of the embodiment shown in FIG. 4.

A semiconductor device of this circuit is shown in FIG. 5 which is a sectional view of the device.

This device comprises a p-type semiconductor substrate 16, an n-type semiconductor body 17 disposed on the substrate 16, p-type isolating regions 18, 19 and 20 extending from the surface of the body 17 to the surface of the substrate 16 so as to form a first isolated region 21 and a second isolated region 22, n-type semiconductor regions 23 and 24 disposed at interfaces between the first isolated region 21 and the substrate 16 and the second isolated region 22 and the substrate 16, respectively, first and second p-type semiconductor regions 25 and 26 disposed in the first isolated region 21, third and fourth p-type semiconductor regions 27 and 28 disposed in the second isolated region 22, first and second n-type semiconductor regions 29 and 30 disposed in the second p-type semiconductor region 26, a third n-type semiconductor region 31 disposed in the second isolated region 22, conductive regions 32, 33, 34, 35 and 36 connected to the first p-type semiconductor region 25, first and second n-type semiconductor regions 29 and 30, the fourth p-type semiconductor region 28 and the third n-type semiconductor region 31, respectively, and a conductive layer 37 connected to the second and third p-type semiconductor regions 26 and 27. The inversely operated first npn transistor 1 comprises the n-type semiconductor body 17, the second p-type semiconductor region 26 and the first and second n-type semiconductor regions 29 and 30. The fourth pnp transistor 6 comprises the second p-type semiconductor region 26, the n-type semiconductor body 17 and the first p-type semiconductor region 25. The fifth pnp transistor 7 comprises the fourth p-type semiconductor region 28, the n-type semiconductor body 17 and the third p-type semiconductor region 27. The load resistor 14 comprises a portion of the n-type semiconductor body 17 between the portion of the body 17 being operated as the base of the fifth transistor 7 and the third n-type semiconductor region 31.

Although, in FIG. 5, only the first, fourth and fifth transistors 1, 6 and 7 and the load resistor 14 are shown, other components, such as the second, third and sixth transistors 2, 5 and 8 and the load resistor 15 are constructed in other portions of the n-type semiconductor body 17 and have similar configurations to the device shown in FIG. 5.

When the conductive region 32 is connected to the first power supply means 9, the conductive regions 33 and 35 are utilized as the output and input terminals 13 and 12, respectively, the conductive region 36 is connected to the conductive region 34, and the other components are connected so as to be the similar connections thereto, the device is operated as the circuit shown in FIG. 4.

In this device, the third and fourth p-type semiconductor regions 27 and 28, i.e. the emitter and the collector of the fifth transistor 7 are formed at the same process of forming the first and second p-type semiconductor regions 25 and 26, which are the emitter of the fourth transistor 6 and the base of the first transistor 1, respectively, and hence this device is fabricated without increasing the steps of fabricating the semiconductor device.

Further, in this device, the flip-flop part is constructed by an IIL circuit, and the fifth transistor 7 is disposed in the isolated region 22 adjacent to the isolated region 21, in which the flip-flop part is disposed, separated by the isolating region 19. Therefore, since the flip-flop part and logic circuits around the flip-flop part can be constructed by IIL circuits, features of IIL circuits can be utilized. Although, in this device, an isolating region is provided, since there are only 11 contact-holes in this device and in the conventional delay-type T-FF circuit device there are 21 such holes, the area on the semiconductor chip becomes about 200 $\mu$m $\times$ 200 $\mu$m in case that the dimensions of the wirings and of the collector size of the inversely operated transistor are the same as those for the chip of the circuit shown in FIG. 1, and hence this device has an advantage with respect to its occupying area.

Furthermore, since, in this circuit, there is only one flip-flop part, the consumption power becomes ⅓, when compared with the conventional delay-type T-FF circuit wherein three flip-flop parts are utilized.

This circuit, however, has such a drawback that its operation range is not so wide, caused by a short time constant of the first and second delay means. That is, for completely inverting the information in the flip-flop, the time constant of the delay means at the charging and discharging the inversely operated first and second transistors should be large enough, but the time constant of the delay means in the circuit shown in FIG. 4 is not high enough, since the junction capacitances of the fifth and sixth transistors 7 and 8 in the circuit shown in FIG. 4 are not so high.

Circuits wherein the drawback described above is eliminated will be explained hereinbelow.

Figure 6:
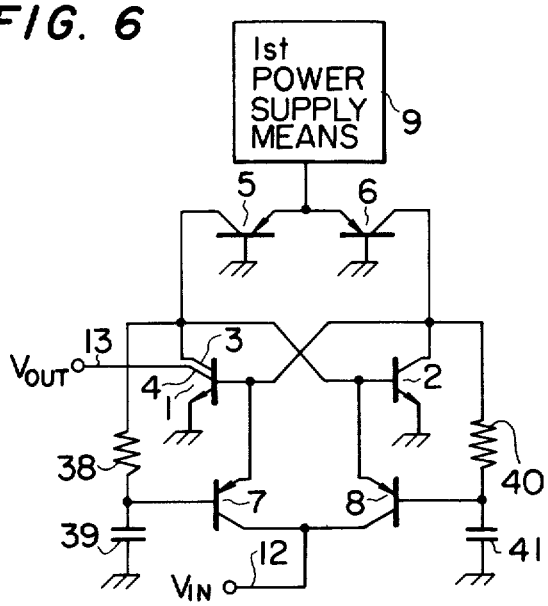
FIGS. 6, 7 and 8 show circuit diagrams of other embodiments of the present invention.

FIG. 6 is a circuit diagram of another embodiment of the present invention.

This circuit is almost same as that shown for FIG. 4 except elements in the first and second delay means. In FIG. 4, the delay means comprises the load resistance and the junction capacitance of the transistor for triggering, but in FIG. 6 it comprises a load resistance connected between the base of the transistor for triggering and the collector of the inversely operated transistor and a capacitor connected between the base of the transistor for triggering and the second power supply means. That is, the first delay means comprises, in the circuit shown in FIG. 6, the junction capacitance of the fifth transistor 7, a resistor 38 connected between the base of the fifth transistor 7 and the collector 3 of the first transistor 1, and a capacitor 39 connected between the base of the fifth transistor 7 and the second power supply means, and the second delay means comprises the junction capacitance of the sixth transistor 8, a resistor 40 connected between the base of the sixth transistor 8 and the collector of the second transistor 2, and a capacitor 41 connected between the base of the sixth transistor 8 and the second power supply means.

The operation range of this circuit shown in FIG. 6 is wider than that of the circuit shown in FIG. 4, since the delay means in this circuit have longer time constants than the delay means shown in FIG. 4.

Figure 7:
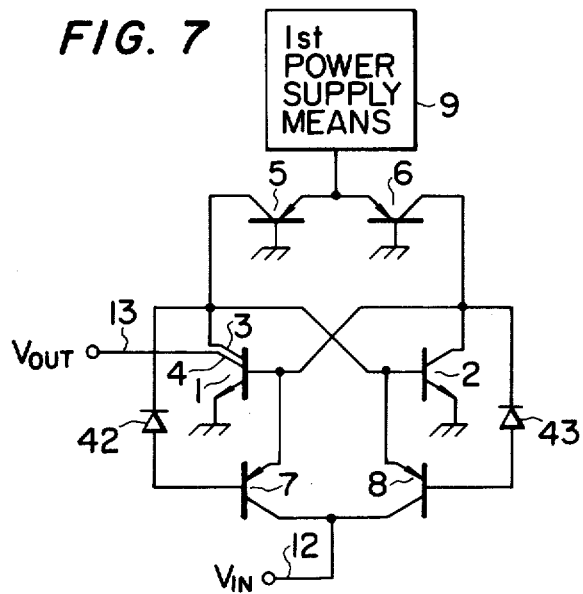

FIG. 7 is a circuit diagram of a still another embodiment of the present invention, wherein the delay means comprising a junction capacitance of the transistor for triggering and a diode is utilized. That is, the first delay means comprises the junction capacitance of the fifth transistor 7 and a diode 42 connected between the base of the fifth transistor 7 and the collector 3 of the first transistor 1, and the second delay means comprises the junction capacitance of the sixth transistor 8 and a diode 43 connected between the base of the sixth transistor 8 and the collector of the second transistor 2. Other components in this circuit shown in FIG. 7 are the same as those in FIG. 4, and the operation thereof is also fundamentally the same as that of the circuit shown in FIG. 4.

This circuit is suitable for high speed operation when compared with that shown in FIG. 6, since the impedance of the diode in the reverse direction is very high, and hence, upon inversion of the flip-flop, information in the inversely connected collectors of the first and second transistors is transferred to the bases of the fifth and sixth transistors for triggering with a delay, and since the impedance of the diode in the forward direction is very low, and hence, at non-inversion of the flip-flop, the information for the next trigger is quickly stored, which is particularly required for the high operation of the T-FF circuits.

This circuit is more suitable for an integrated circuit than that shown in FIG. 6, since this circuit does not require the capacitors 39 and 41 shown in FIG. 6.

Figure 8:
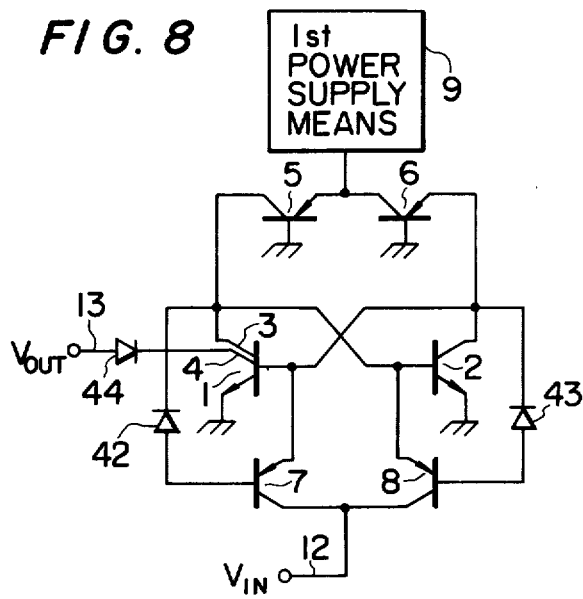

FIG. 8 is a circuit diagram of a further embodiment of the present invention, wherein a diode 44 is further provided between the output terminal 13 and the collector 4 of the first transistor 1 in the circuit shown in FIG. 7.

In this circuit, the output of the flip-flop circuit can be obtained from the output terminal 13 through the diode 44, and the output may be introduced into an input of a subsequent stage. Other components shown in FIG. 8 are the same as those shown in FIG. 7.

Although, in the embodiments shown in FIGS. 4, 6, 7 and 8, it is not specifically described that the first and second transistors 1 and 2 are inversely operated vertical types and the third and fourth transistors 5 and 6 are lateral types, when they are such types, an IIL circuit is obtained, and hence the occupying area thereof on the semiconductor chip becomes small and the power consumption thereof becomes very low.

Although preferred embodiments of the present invention have been designed above, the present invention is not limited to those embodiments.

For example, although the bases of the third and fourth transistors 5 and 6, and the emitters of the first and second transistors 1 and 2 are connected to the second power supply means, the present invention may be operated by connecting the bases of the third and fourth transistors 5 and 6 to third power supply means.

Although npn transistors and pnp transistors are utilized as the first and second transistors 1 and 2 and the third, fourth, fifth and sixth transistors 5, 6, 7 and 8, respectively, the polarity relations may reversed. It should be noted that the polarity of the diode and the polarities of the first, second and third power supply means are reversed when the polarity relations of the transistors are reversed and the diode is utilized in the circuit.

While the present invention has been shown and described in terms of the best mode contemplated for carrying out the invention, it will be appreciated that changes and modifications can be made which do not depart from the inventive concepts taught herein. Such changes and modifications are deemed to be within the purview of the present invention.

What is claimed is:

1. A trigger-type flip-flop circuit comprising:
   a pair of inversely operated vertical type first and second transistors, said first transistor having dual collectors;
   a pair of lateral type third and fourth transistors, each having a polarity opposite to that of said first transistor and operated as a load;
   a pair of triggering fifth and sixth transistors, each of which has a polarity opposite to that of said first transistor;
   the bases of said first and second transistors being connected to the collector of said second transistor and to one of the dual collectors of said first transistor, respectively;
   the collectors of said third and fourth transistors being connected to said one of the dual collectors of said first transistor and to the collector of said second transistor, respectively;
   the emitters of said third and fourth transistors being connected to a first power supply means;
   the bases of said first and second transistors being connected to the emitters of said fifth and sixth transistors, respectively;
   the bases of said fifth and sixth transistors being connected to said one of the dual collectors of said first transistor through first delay means and to the collector of said second transistor through second delay means, respectively;
   the collectors of said fifth and sixth transistors being connected to an input terminal for trigger signals;
   an output terminal connected to the other collector of the dual collectors of said first transistor;
   the emitters of said first and second transistors being electrically connected to a ground terminal; and
   the bases of said third and fourth transistors being electrically connected to said ground terminal.

2. A trigger type flip-flop circuit according to claim 1, wherein said fifth and sixth transistors are lateral type transistors.

3. A trigger-type flip-flop circuit according to claim 1, wherein said first delay means includes a load resistor connected between the base of said fifth transistor and said one of the dual collectors of said first transistor, and said second delay means includes a load resistor connected between the base of said sixth transistor and the collector of said second transistor.

4. A trigger-type flip-flop circuit according to claim 1, wherein said first delay means includes a diode connected between the base of said fifth transistor and said one of the dual collectors of said first transistor, and said second delay means includes a diode connected between the base of said sixth transistor and the collector of said second transistor.

5. A trigger-type flip-flop circuit according to claim 4, which further comprises a diode connected between said other collector of the dual collectors of said first transistor and said output terminal.

6. A trigger-type flip-flop circuit according to claim 1, wherein said first and second transistors are npn vertical transistors, and said third, fourth, fifth and sixth transistors are pnp lateral transistors.

7. A trigger-type flip-flop circuit according to claim 3, wherein said first delay means further includes a capacitor being electrically connected between the base of said fifth transistor and said ground terminal, and said second delay means further includes a capacitor being electrically connected between the base of said sixth transistor and said ground terminal.

* * * * *